United States Patent
Wu et al.

(10) Patent No.: US 6,548,363 B1
(45) Date of Patent: Apr. 15, 2003

(54) METHOD TO REDUCE THE GATE INDUCED DRAIN LEAKAGE CURRENT IN CMOS DEVICES

(75) Inventors: Chung-Cheng Wu, Tou-Cheng (TW); Bi-Ling Lin, Hsin-chu (TW); Carlos Hernando Diaz, Hsin-Chu (TW)

(73) Assignee: Taiwan Semiconductor Manufacturing Company, Hsin-Chu (TW)

( * ) Notice: Subject to any disclaimer, the term of this patent is extended or adjusted under 35 U.S.C. 154(b) by 0 days.

(21) Appl. No.: 09/547,237

(22) Filed: Apr. 11, 2000

(51) Int. Cl.$^7$ .......................................... H01L 21/336
(52) U.S. Cl. ...................... 438/305; 438/303; 438/770
(58) Field of Search ............................. 438/305, 306, 438/307, 299, 199, 770, 778, 303

(56) References Cited

U.S. PATENT DOCUMENTS

| | | | | |
|---|---|---|---|---|
| 5,208,175 A | * | 5/1993 | Choi et al. .................... | 438/257 |
| 5,296,094 A | * | 3/1994 | Shan et al. ................... | 156/651 |
| 5,371,026 A | | 12/1994 | Hayden et al. ................ | 437/41 |
| 5,382,533 A | * | 1/1995 | Ahmad et al. ................. | 438/305 |
| 5,489,545 A | * | 2/1996 | Taguchi ........................ | 438/201 |
| 5,498,556 A | | 3/1996 | Hong et al. ................... | 437/35 |
| 5,834,346 A | | 11/1998 | Sun et al. ..................... | 438/231 |
| 5,858,840 A | | 1/1999 | Hsieh et al. .................. | 438/266 |
| 5,858,844 A | | 1/1999 | Fang et al. .................... | 438/303 |
| 5,879,992 A | | 3/1999 | Hsieh et al. .................. | 438/264 |
| 5,915,178 A | | 6/1999 | Chiang et al. ................. | 438/266 |
| 6,081,010 A | * | 6/2000 | Sanchez ........................ | 257/344 |
| 6,143,673 A | * | 11/2000 | Jang et al. .................... | 438/778 |
| 6,156,602 A | * | 12/2000 | Shao et al. ................... | 438/238 |
| 6,271,572 B1 | * | 8/2001 | Fujita ........................... | 257/392 |

* cited by examiner

*Primary Examiner*—Michael Trinh
(74) *Attorney, Agent, or Firm*—George O. Saile; Stephen B. Ackerman; Stephen G. Stanton

(57) ABSTRACT

A method for forming FET devices with attenuated gate induced drain leakage current. There is provided a silicon semiconductor substrate employed within a microelectronics fabrication. There is formed within the silicon substrate field oxide (FOX) dielectric isolation regions defining an active silicon substrate device area. There is formed over the substrate a silicon oxide gate oxide insulation layer employing thermal oxidation. There is then formed over the silicon oxide gate oxide insulation layer a patterned polycrystalline silicon gate electrode layer. There is then thermally oxidized the substrate and polycrystalline silicon gate electrode to form a thicker silicon oxide layer at the edge of the gate electrode and in the adjacent silicon substrate area. There is then etched back the thicker silicon oxide layer from the silicon substrate area adjacent to the gate electrode. There is then formed employing low energy ion implantation shallow junction source-drain extension regions adjacent to the gate electrode. There is then formed source-drain regions to complete the FET device, which exhibits attenuated drain leakage current. The present invention may be employed to fabricate complementary metal-oxide-silicon (CMOS) FET devices of either polarity with attenuated gate induced drain leakage (GIDL) current, short channel effect (SCE) and punch-through leakage current in integrated circuit microelectronics fabrications wherein low power drain is desired.

17 Claims, 5 Drawing Sheets

METHOD TO REDUCE THE GATE INDUCED DRAIN LEAKAGE CURRENT IN CMOS DEVICES

BACKGROUND OF THE INVENTION

1. Field of the Invention

The present invention relates generally to the field of manufacture of electronics devices. More particularly, the present invention relates to the field of fabrication of complementary metal-oxide-silicon field effect transistor devices in microelectronics fabrications.

2. Description of the Related Art

In the field of electronics devices, there is considerable interest in complementary metal-oxide-silicon (CMOS) field effect transistor (FET) devices employed within microelectronics fabrications. The CMOS approach connects FET devices of opposite p- and n-type polarity together into binary or "flip-flop" circuits and permits the manufacture of integrated circuit microelectronics fabrications with extremely low power consumption since there is essentially no current flow except during actual switching of the circuits from one state to the other.

Along with the CMOS design and its inherently low power consumption, it is also desirable to have a low drain leakage current for the individual FET device in a CMOS application, along with low threshold switching voltage and high gain, to further minimize power consumption. In general, these desired features are available in conventional FET devices and CMOS circuits due to increasingly smaller dimensions; in particular, gate oxide insulation layers are formed as thin as practicable within the limits of dielectric breakdown and device yield to reduce threshold voltages and increase device current gain. Although practical CMOS FET devices may be fabricated to approach these desired performance limits, such devices are not without problems.

In deep sub-micron CMOS FET devices, the gate induced drain leakage (GIDL) current increases because the gate oxide insulation layer thickness is reduced to as low as 40 angstroms. Gate induced leakage current may be reduced by forming a thicker gate oxide at the gate edge ("bird's beak") employing thermal oxidation after gate definition. While thus reducing gate induced leakage current, such designs present other problems in fabrication and device operation.

It is thus towards the goal of reducing drain leakage current in FET devices that the present invention is generally directed. More particularly, it is towards the goal of reduction of gate induced drain (GIDL) leakage current in CMOS FET devices that the present invention is more specifically directed.

Various methods have been disclosed for the control of drain leakage and other leakage currents as well as other parameters in FET devices.

For example, Hayden et al., in U.S. Pat. No. 5,371,026, disclose a method for forming coupled MOS FET devices in which the current gain of the first device exceeds that of the second device. The method employs differential formation of thicker silicon oxide gate oxide insulating layer at the edge of one transistor but not the other, resulting in a higher channel resistance and hence lower current gain in the first device.

Further, Hong et al., in U.S. Pat. No. 5,498,556, disclose a method for forming a MOS FET device with reduced gate induced drain leakage current and reduce drain overlap region capacitance. The method employs oxidation of the gate electrode and substrate to produce thicker silicon oxide gate oxide at the edges of the gate electrode, followed by complete removal of the silicon oxide from the region beyond the gate electrode and implantation of source and drain regions. Subsequent angled ion implantation forms source and drain extensions under the edges of the gate electrode, minimizing overlap capacitance.

Still further, Sun et al., in U.S. Pat. No. 5,834,346, disclose a method for preventing formation of gas bubbles over source-drain regions in p-channel MOSFET devices. The bubbles are caused by outgassing of implanted species such as $BF_2^+$ into subsequently deposited glass layers during reflow. The method partially replaces the plasma etch process which contributes to the adsorption of $BF_2^+$ with a wet etch process to mitigate the adsorption of $BF_2^+$.

Still further yet, Hsieh et al. in U.S. Pat. No. 5,858,840, disclose a method for forming a split-gate FET flash memory cell with increased erase speed. The method employs the selective implantation of nitrogen ions such that the floating gate region, which is not implanted, oxidizes faster to form a thicker silicon oxide region or "bird's beak" of a sharper shape at the edge of the floating gate, resulting in an increase in erase speed of the memory cell.

Yet still further, Fang et al., in U.S. Pat. No. 5,858,844, disclose a method for forming an FET device with optimized performance. The method employs an oxidation of the polycrystalline silicon gate electrode to increase the silicon oxide gate oxide insulation thickness at the edge of the gate electrode. Subsequently the source and drain regions are formed by ion implantation.

Yet further still, Hsieh et al., in U.S. Pat. No. 5,879,992, disclose a method for forming a split-gate FET flash memory cell with improved performance. The method employs a step polycrystalline silicon layer and a dielectric spacer layer formed between the step polysilicon layer and a control gate electrode.

Finally, Chiang et al., in U.S. Pat. No. 5,915,178, disclose a method for forming a FET flash memory cell for an electronically programmable read-only memory which has increased longevity of switching cycles. The method employs a shallow arsenic heavily doped source region adjacent to the floating gate and control gate region.

Desirable in the art of microelectronics fabrication are further methods for forming CMOS FET devices with reduced drain leakage and other leakage currents, and in particular methods for reducing gate induced drain leakage (GIDL) current.

It is towards these goals that the present invention is generally and more specifically directed.

SUMMARY OF THE INVENTION

It is a first object of the present invention to provide a method for forming within a silicon semiconductor substrate employed within a microelectronics fabrication a field effect transistor (FET) device with reduced leakage current.

It is a second object of the present invention to provide a method in accord with the first object of the present invention where there is formed within a silicon semiconductor substrate employed within an integrated circuit microelectronics fabrication complementary metal-oxide-silicon (CMOS) field effect transistor (FET) devices with attenuated gate induced drain leakage current, short channel effect and punch-through leakage current.

It is a third object of the present invention to provide a method in accord with the first object of the present invention and/or the second object of the present invention, where the method is readily commercially implemented.

In accord with the objects of the present invention, there is provided a method for forming FET devices with attenuated drain leakage current. To practice the invention, there is provided a silicon semiconductor substrate employed within a microelectronics fabrication. There is formed within the silicon semiconductor substrate field oxide (FOX) dielectric isolation regions defining an active device area of the silicon substrate. There is formed over the silicon substrate in the active device area a silicon oxide gate oxide dielectric layer employing thermal oxidation. There is then formed over the silicon oxide gate oxide dielectric layer a patterned polycrystalline silicon gate electrode layer. There is then thermally oxidized the silicon substrate and gate electrode to form a thicker silicon oxide gate oxide dielectric layer at the edge of the patterned polycrystalline silicon gate electrode layer and in the adjacent silicon substrate area. There is then etched back the silicon oxide dielectric layer from the silicon substrate region beyond the gate electrode employing an anisotropic self-aligned etch process. There is then formed shallow junction source-drain extension (SDE) regions adjacent to the gate electrode by low energy ion implantation. There are then formed source and drain regions employing ion implantation to complete the fabrication of FET devices with attenuated gate induced drain leakage current (GIDL).

The method of the present invention provides shallow source-drain extension (SDE) junction regions formed by low energy ion implantation which affords inherent low drain leakage current. The present invention is particularly applicable to fabrication of complementary metal-oxide-silicon (CMOS) FET devices of either polarity to afford low power consumption microelectronics fabrications. The thicker silicon oxide gate oxide dielectric layer provided at the edge of the polycrystalline silicon gate electrode layer by thermal oxidation results in attenuated gate induced drain leakage (GIDL) current, as well as the short channel effect (SCE) and punch-through leakage current, thereby reducing power consumption. The thicker silicon oxide gate oxide dielectric layer at the gate electrode edge also reduces the gate-drain overlap capacitance, which improves the high-frequency performance of the FET device.

The present invention employs methods and materials which are known in the art of integrated circuit microelectronics fabrication, but in an order, arrangement and sequence which is novel. Therefore the method of the present invention is readily commercially implemented.

BRIEF DESCRIPTION OF THE DRAWINGS

The objects, features and advantages of the present invention are understood within the context of the Description of the Preferred Embodiments, as set forth below. The Description of the Preferred Embodiments is understood within the context of the accompanying drawings, which form a material part of this disclosure, wherein.

DESCRIPTION OF THE PREFERRED EMBODIMENTS

The present invention provides a method for forming within a silicon semiconductor substrate employed within a microelectronics fabrication field effect transistor (FET) devices with attenuated gate induced drain leakage (GIDL) current, short channel effect (SCE) and punch-through leakage current. To achieve the objects of the present invention, there are provided FET devices with patterned polycrystalline silicon gate electrode layers which after are thermally re-oxidized to form a thicker silicon oxide gate oxide layer at the edges of the gate electrode layer. There is then removed the silicon oxide dielectric layer beyond the gate electrode by etching back the silicon oxide employing an anisotropic self-aligned plasma etching process. There is then formed shallow junction source-drain extension (SDE) regions by low energy ion implantation, after which are formed source and drain regions by ion implantation to provide attenuated gate induced drain leakage (GIDL) current, short channel effect (SCE) and punch-through leakage current.

First Preferred Embodiment

Figure 1:
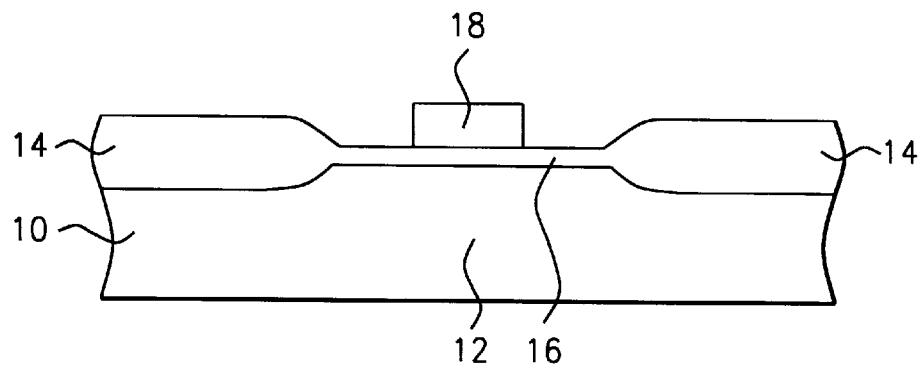
FIG. 1, FIG. 2, FIG. 3, FIG. 4 and FIG. 5 are a series of schematic cross-sectional diagrams illustrating the formation within a silicon semiconductor substrate employed within a microelectronics fabrication a field effect transistor (FET) device with attenuated short channel effect (SCE), gate induced drain leakage current (GIDL) and punch-through leakage current, in accord with a general embodiment of the present invention.

FIG. 1 to FIG. 5 are a series of schematic cross-sectional diagrams illustrating the results of forming FET devices with attenuated drain leakage current in accord with a general embodiment of the present invention which constitutes a first preferred embodiment of the present invention. FIG. 1 is a schematic cross-sectional diagram of a microelectronics fabrication at an early stage in its fabrication in accord with the first preferred embodiment of the present invention.

Shown in FIG. 1 is a silicon semiconductor substrate 10 within which are formed an active device region 12 defined by silicon oxide dielectric field oxide (FOX) isolation regions 14. Within the active device region 12 are formed a gate oxide dielectric layer 16 over which is formed a patterned polycrystalline silicon gate electrode layer 18.

With respect to the silicon substrate 10 shown in FIG. 1, the silicon substrate 10 may be the substrate itself employed within a microelectronics fabrication. Alternatively the substrate 10 may be any of several layers of semiconductor silicon formed upon a substrate. The silicon substrate may be of either polarity of doping, since both p-type and n-type silicon regions may be employed to form the corresponding polarity FET devices employed in microelectronics fabrications and circuits. The silicon semiconductor substrate 10 may be employed within a microelectronics fabrication including but not limited to integrated circuit microelectronics fabrications and charge coupled microelectronics fabrications. Preferably the silicon semiconductor substrate 10 is a single crystal silicon substrate of (100) crystalline orientation.

With respect to the silicon active device region 12 shown in FIG. 1, the active device region 12 is formed by thermal oxidation of the silicon semiconductor substrate 10 to form the silicon oxide dielectric field oxide (FOX) isolation regions 14 shown in FIG. 1. Formed within the active device region 12 is a gate oxide dielectric layer 16 of silicon oxide dielectric material formed employing thermal oxidation of the silicon semiconductor substrate. Preferably the silicon oxide gate oxide dielectric layer is formed by thermal oxidation of silicon at a temperature of from about 750 to about 1050 degrees centigrade in dry or wet oxidizing environment to a thickness of from about 15 to about 100 angstroms.

With respect to the patterned polycrystalline silicon gate electrode layer 18 shown in FIG. 1, the patterned polycrystalline silicon gate electrode layer 18 is formed over the silicon oxide gate oxide dielectric layer 16 employing methods and materials known in the art of microelectronics fabrication. Preferably the polycrystalline silicon gate electrode layer 18 is formed employing chemical vapor deposition (CVD) in accord with the following process conditions: (1) silane ($SiH_4$) silicon source gas at a gas flow rate of from about 10 to about 1000 standard cubic centimeters per minute (sccm); (2) temperature from about 500 to about 700 degrees centigrade; (3) pressure form about 10 to 1000 mTorr; and (4) hydrogen carrier gas. Preferably the polycrystalline silicon gate electrode layer 18 is formed to a thickness of from about 1500 to about 2500 angstroms, and is patterned employing photolithographic methods and materials as are known in the art of microelectronics fabrication.

Figure 2:
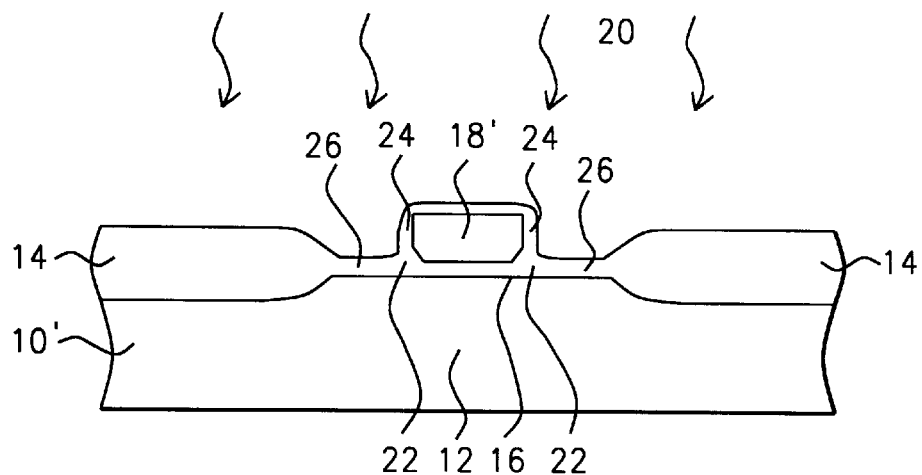

Referring now more particularly to FIG. 2, there is shown a schematic cross-sectional diagram illustrating the results of further processing of the microelectronics fabrication whose schematic cross-sectional diagram is shown in FIG. 1 in accord with the first preferred embodiment of the present invention. Shown in FIG. 2 is a microelectronics fabrication otherwise equivalent to the microelectronics fabrication shown in FIG. 1, but where there has been thermally oxidized the patterned polycrystalline gate electrode layer and silicon semiconductor substrate in an oxidizing environment 20 to form a thicker silicon oxide layer 22 at the edge of the patterned polycrystalline silicon gate electrode layer 18, a silicon oxide spacer layer 24 on the side of the gate electrode layer and a silicon oxide layer elsewhere in the active silicon region 26 beyond the gate electrode layer edges.

Figure 3:
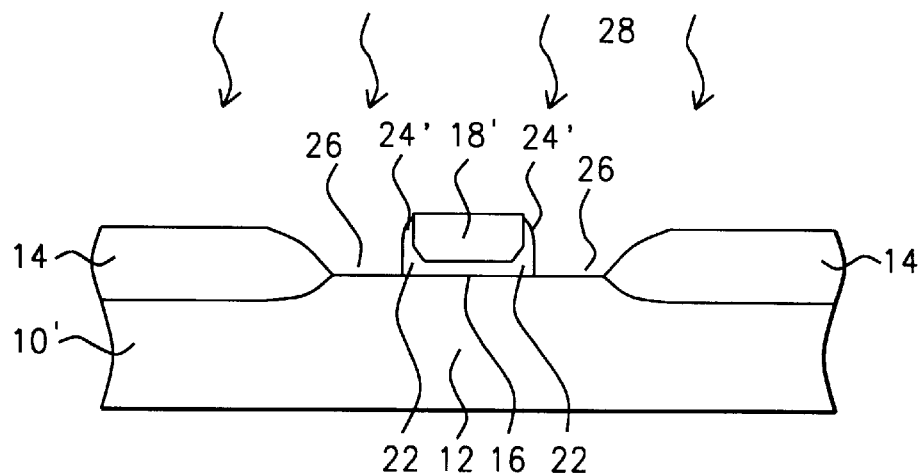

With respect to the thermal oxidation process 20 which forms the silicon oxide layers 22, 24 and 26 shown in FIG. 3, the thermal oxidation process 20 employs the following process conditions: (1) oxidizing gases $O_2$ and $H_2O$ at a gas flow rate of from about 10 to about 100 standard cubic centimeters per minute (sccm) in $H_2$ carrier gas at a total pressure of about 760 Torr; (2) temperature from about 800 to about 1000 degrees centigrade; (3) time from about 5 sec to about 1 hour. Preferably the regrown silicon oxide layer 22 is formed to a thickness of from about 30 to about 80 angstroms at the edge of the patterned polycrystalline silicon gate electrode layer and over the silicon substrate region beyond the edge of the gate electrode layer.

Referring now more particularly to FIG. 3, there is shown a schematic cross-sectional diagram illustrating the results of further processing of the microelectronics fabrication whose schematic cross-sectional diagram is shown in FIG. 2 in accord with the present invention. Shown in FIG. 3 is a microelectronics fabrication otherwise equivalent to the microelectronics fabrication shown in FIG. 2, but where there has been etched back the regrown thicker silicon oxide layer 26 in the region beyond the gate electrode employing an anisotropic self-aligned plasma etching process 28.

With respect to the anisotropic self-aligned plasma etching process 28 shown in FIG. 3, the self-aligned anisotropic plasma etching process 28 employs the following process conditions: (1) etching gases $CF_4/CHF_3$ in $H_2$; (2) temperature about 10 to about 200 degrees centigrade; (3) time from about 2 seconds to about 10 minutes. Preferably the regrown silicon oxide layer is etched back to expose the silicon surface.

Figure 4:
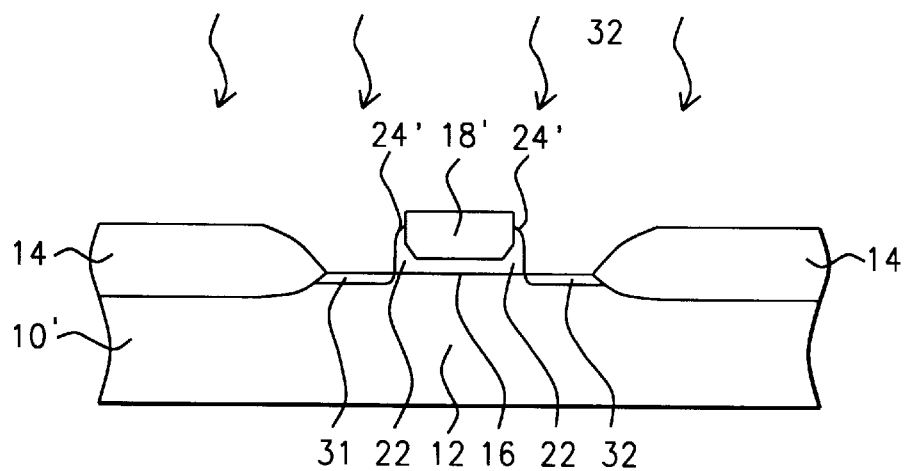

Referring now more particularly to FIG. 4, there is shown a schematic cross-sectional diagram illustrating the results of further processing of the microelectronics fabrication whose schematic cross-sectional diagram is shown in FIG. 3 in accord with the first preferred embodiment of the present invention. Shown in FIG. 4 is a microelectronics fabrication otherwise equivalent to the integrated circuit microelectronics fabrication shown in FIG. 3, but where there has been formed shallow source-drain extension (SDE) regions 30 and 31 by low energy ion implantation 32.

With respect to the shallow junction source and drain extension regions 30 and 31 formed by low energy ion implantation process 32 shown in FIG. 4, the shallow junction source and drain regions 31 and 30 are formed to a junction depth preferably of from about 200 to about 800 angstroms employing the following low energy ion implantation process conditions: (1) ion species As, $BF_2$, B; (2) ion implantation energy less than about 6 kEv; (3) ion implantation dose greater than about 1E13 ions/square centimeter ($cm^2$); (4) anneal from about 900 to about 1050 degrees centigrade.

Figure 5:
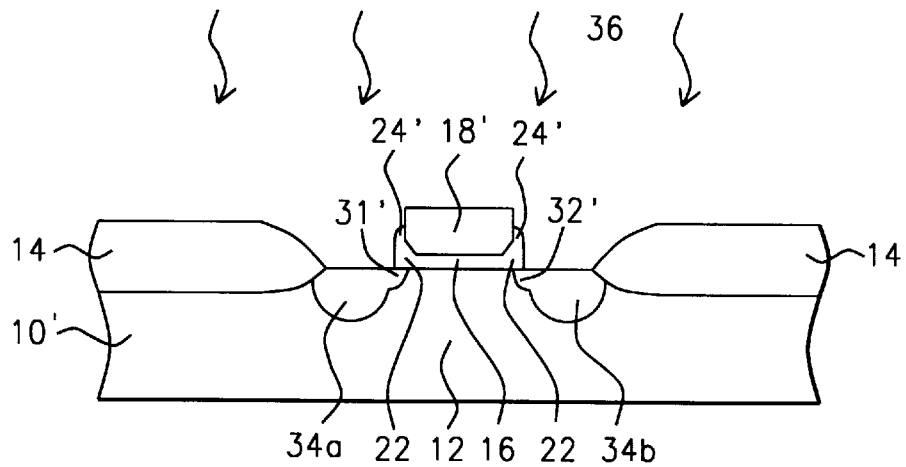

Referring now more particularly to FIG. 5, there is shown a schematic cross-sectional diagram illustrating the final results of further processing of the microelectronics fabrication whose schematic cross-sectional diagram is shown in FIG. 4. Shown in FIG. 5 is a microelectronics fabrication otherwise equivalent to the microelectronics fabrication shown in FIG. 4, but where there has been formed the source region 34a and drain region 34b of the FET device employing an ion implantation process 36.

With respect to the source and drain regions 34a and 34b shown in FIG. 5, the source and drain regions 34a and 34b are formed employing an ion implantation process 36. Preferably the ion implantation process employs the following process conditions: (1) ion species As, $BF_2$, B; (2) accelerating voltage from about 1 to about 100 kilo-electron-volts (kEv); (3) dose greater than about 1E13 ions per square centimeter ($cm^2$); (4) anneal from about 900 to about 1100 degrees centigrade.

The first embodiment of the present invention provides a method for forming within a silicon semiconductor substrate employed within a microelectronics fabrication FET devices with attenuated gate induced leakage current (GIDL), short channel effect (SCE) and punch through leakage current. The method employs thermal oxidation of the substrate region near and beyond the edge of the polysilicon gate electrode to form a thicker silicon oxide dielectric layer at the electrode edge. This is followed by etching back the thicker silicon oxide beyond the gate electrode employing an anisotropic self-aligned etch back process, to permit low energy ion implantation to form shallow source-drain extension regions. Upon completion of fabrication, there have been formed FET devices with reduced threshold voltages and electric fields at the gate electrode edges, attenuating the gate induced drain leakage current, short channel effect and punch through leakage current.

The present invention provides a thicker silicon oxide dielectric layer at the sides and edges of the patterned polycrystalline silicon gate electrode layer which serves to reduce gate drain overlap capacitance and lower the electric field in the silicon oxide dielectric layer. Both of these effects are beneficial in improving FET device high-frequency performance and reliability.

Second Preferred Embodiment

Figure 6:
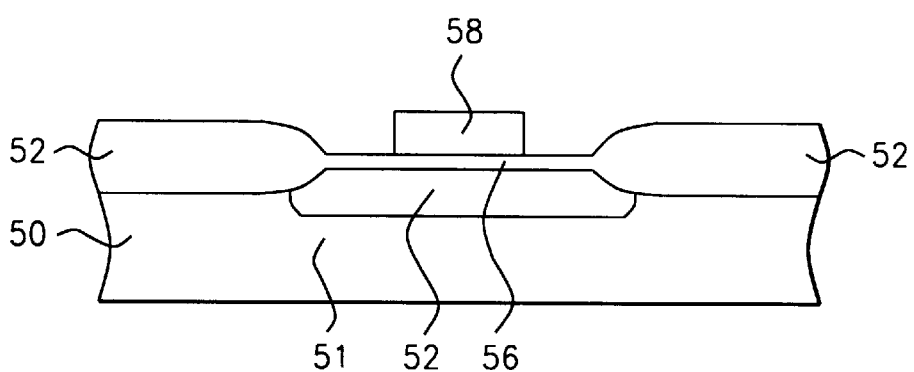
FIG. 6, FIG. 7, FIG. 8, FIG. 9 and FIG. 10 are a series of schematic cross-sectional diagrams illustrating the formation within a silicon semiconductor substrate employed within a integrated circuit microelectronics fabrication a complementary metal-oxide-silicon (CMOS) field effect transistor (FET) device with attenuated gate induced drain leakage (GIDL) current, short channel effect (SCE) and punch-through leakage current

FIG. 6 to FIG. 10 are a series of schematic cross-sectional diagrams illustrating the results of forming upon a silicon substrate employed within an integrated circuit microelectronics fabrication complementary metal-oxide-silicon (CMOS) field effect transistor (FET) devices with attenuated gate induced drain leakage (GIDL) current, short channel effect (SCE) and punch-through leakage current, in accord with a more specific embodiment of the present invention which constitutes a second preferred embodiment of the present invention. FIG. 6 is a schematic cross-sectional diagram of a silicon semiconductor substrate employed within an integrated circuit microelectronics fabrication at an early stage in its fabrication in accord with a second preferred embodiment of the present invention.

Shown in FIG. 6 is a silicon semiconductor substrate 50 within which is formed silicon oxide field oxide (FOX) dielectric isolation regions 52 which define an active device area 54 of the silicon semiconductor substrate 50. Within the active device area 52 there is a region of or well of opposite polarity of doping 51 to that of the bulk of the silicon semiconductor substrate 50. Formed over the silicon semiconductor substrate active device area 52 is a gate oxide dielectric layer 56 in the active device area 52. Formed over the gate oxide dielectric layer is a patterned polycrystalline silicon gate electrode layer 58.

With respect to the silicon semiconductor substrate 50 shown in FIG. 6, the silicon semiconductor substrate 50 is analogous to the silicon semiconductor substrate 10 shown in FIG. 1 of the first preferred embodiment of the present invention. Since it is inherent in the art of CMOS FET device manufacturing to fabricate FET devices of opposite polarity within the same silicon substrate, it is required to form regions of both p- and n-type doping to enable this to be done. The methods and materials employed to form the regions of opposite polarity and to fabricate both types of CMOS FET devices in the same silicon semiconductor substrate are well known in the art of microelectronics fabrication. Thus only one type of FET device fabrication will be shown schematically in the second preferred embodiment of the present invention, it being understood that analogous or equivalent methods and materials would be employed to fabricate the complementary type of FET device required in general for CMOS device designs. Preferably the silicon semiconductor substrate 50 is a p-type silicon single crystal substrate of (100) crystalline orientation With respect to the field oxide isolation regions 54 which define the active device area 52 of the substrate 50 shown in FIG. 6, the field oxide isolation regions 54 and the active device area 52 are equivalent or analogous to the field oxide isolation areas 14 and the active device areas 12 shown in FIG. 1 of the first preferred embodiment of the present invention. With respect to the well of silicon formed with the opposite doping polarity 53 to the substrate 50, the well of opposite polarity doping 53 is formed by methods which are known in the art of microelectronics fabrication including but not limited to ion implantation and thermal diffusion. Preferably the silicon well 53 is doped with n-type dopant With respect to the gate oxide dielectric layer 56 shown in FIG. 6, the gate oxide dielectric layer 56 is formed of silicon oxide dielectric material equivalent or analogous to the silicon oxide gate oxide dielectric layer 16 shown in FIG. 1 of the first preferred embodiment of the present invention.

With respect to the patterned polycrystalline silicon gate electrode layer 58 shown in FIG. 6, the patterned polycrystalline silicon gate electrode layer 58 is analogous or equivalent to the patterned polycrystalline gate electrode layer 18 shown in FIG. 1 of the first preferred embodiment of the present invention..

Figure 7:
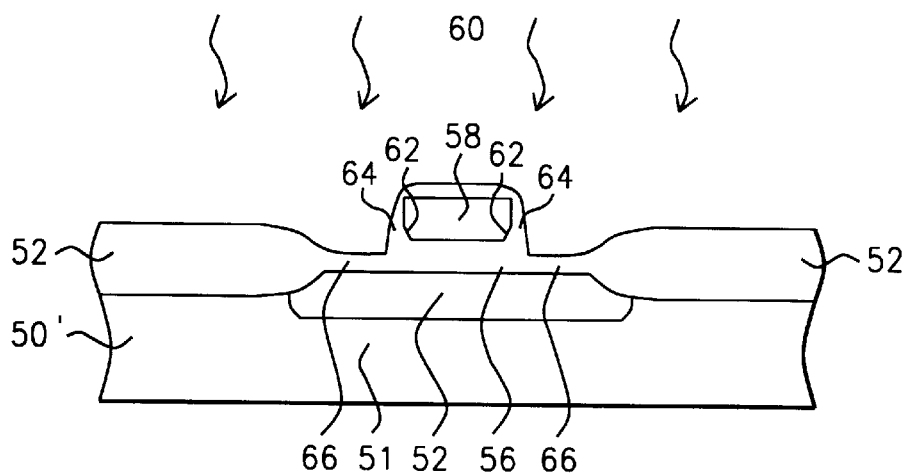

Referring now more particularly to FIG. 7, there is shown a schematic cross-sectional diagram illustrating the results of further processing of the integrated circuit microelectronics fabrication whose schematic cross-sectional diagram is shown in FIG. 6 in accord with a second preferred embodiment of the present invention. Shown in FIG. 7 is an integrated circuit microelectronics fabrication otherwise equivalent to the integrated circuit microelectronics fabrication shown in FIG. 6, but where there has been formed by thermal oxidation in an oxidizing environment 60 the silicon semiconductor substrate 50 and patterned polycrystalline silicon gate electrode layer 58 to form a thicker silicon oxide gate oxide dielectric layer 62 at the edge of the gate electrode layer, a spacer silicon oxide dielectric layer 64 on the side of the gate electrode layer 58 and a silicon oxide dielectric layer 66 in the active device area beyond the gate electrode layer 58.

With respect to the oxidizing environment 60 shown in FIG. 7 to produce the thicker silicon oxide gate oxide dielectric layer 62 at the edge of the patterned polycrystalline gate electrode layer, the silicon oxide spacer layer 64 on the edge of the patterned polycrystalline silicon gate electrode layer and the thicker silicon oxide dielectric layer 66 in the active device area beyond the gate electrode layer, the oxidizing environment 60, thicker silicon oxide dielectric layer 62, silicon oxide dielectric spacer layer 64 and silicon oxide dielectric layer 66 are analogous or equivalent to the oxidizing environment 23, thicker silicon oxide gate oxide dielectric layer 24, spacer silicon oxide dielectric layer 25 and silicon oxide dielectric layer 26 shown in FIG. 3 of the first preferred embodiment of the present invention.

Figure 8:
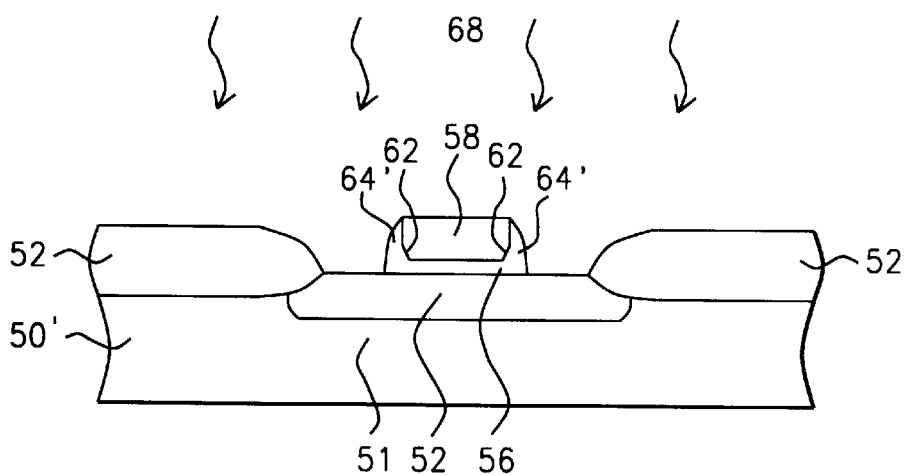

Referring now more particularly to FIG. 8, there is shown a schematic cross-sectional diagram illustrating the results of further processing of the integrated circuit microelectronics fabrication shown in FIG. 7 in accord with a second preferred embodiment of the present invention. Shown in FIG. 8 is an integrated circuit microelectronics fabrication otherwise equivalent to the integrated circuit microelectronics fabrication shown in FIG. 7, but where there has been etched back the regrown silicon oxide dielectric layer 66 in the region beyond the gate electrode employing an anisotropic self-aligned plasma etching process 68.

With respect to the anisotropic self-aligned plasma etching process 68 shown in FIG. 8, the anisotropic self-aligned plasma etching process 68 is analogous or equivalent to the anisotropic self-aligned plasma etching process 28 shown in FIG. 3 of the first preferred embodiment of the present invention.

Figure 9:
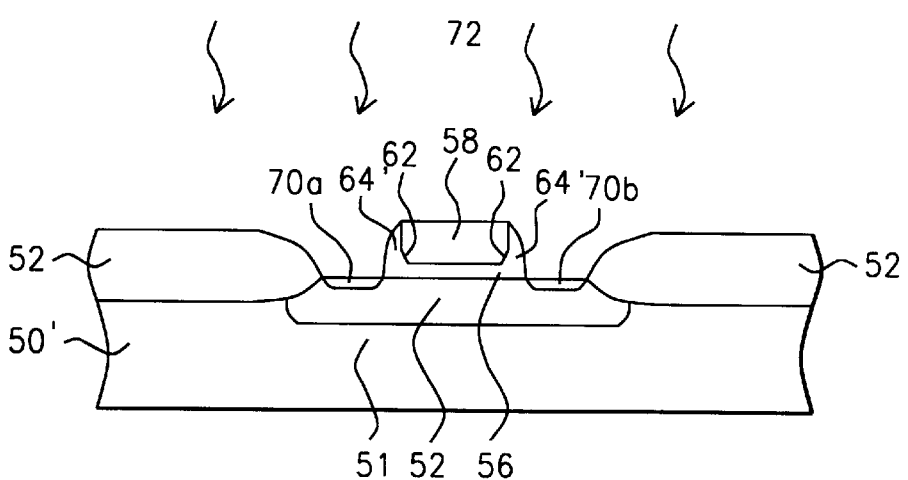

Referring now more particularly to FIG. 9, there is shown a schematic cross-sectional diagram illustrating the results of further processing of the integrated circuit microelectronics fabrication whose schematic cross-sectional diagram is shown in FIG. 8 in accord with a second preferred embodiment of the present invention. Shown in FIG. 9 is an integrated circuit microelectronics fabrication otherwise equivalent to the integrated circuit microelectronics fabrication shown in FIG. 8, but where there has been implanted shallow junction source-drain extension p⁻ (SDE) regions 70a and 70b in the region beyond the gate electrode employing a low-energy ion implantation process 72 of p-type dopant ions, in accord with a second preferred embodiment of the present invention.

With respect to the low energy ion implantation process 72 shown in FIG. 9, the low energy ion implantation process 72 is analogous or equivalent to the low energy ion implantation process 32 shown in FIG. 4 of the first preferred embodiment of the present invention.

Figure 10:
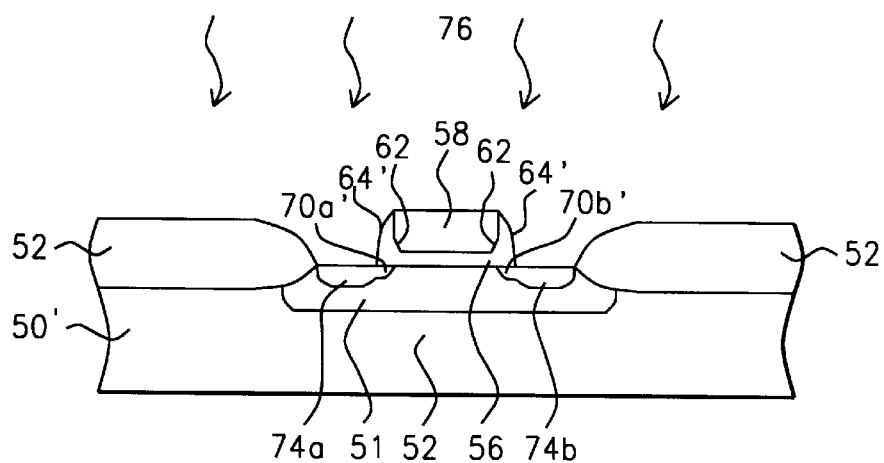

Referring now more particularly to FIG. 10, there is shown a schematic cross-sectional diagram illustrating the final results of further processing of the integrated circuit microelectronics fabrication whose schematic cross-sectional diagram is shown in FIG. 9 in accord with a second preferred embodiment of the present invention. Shown in FIG. 10 is an integrated circuit microelectronics fabrication otherwise equivalent to the integrated circuit microelectronics fabrication shown in FIG. 9, but where there has formed the p⁺ source region 74a and the p⁺ drain region 74b of a p-channel FET device employing a p-dopant ion implantation process 76 in accord with a second preferred embodiment of the present invention.

With respect to the p⁻ source and drain regions 74a and 74b shown in FIG. 10, the source and drain regions 74a and 74b are analogous or equivalent to the source region 34a and the drain region 34b shown in FIG. 5 of the first preferred embodiment of the present invention. With respect to the p-type dopant ion implantation process 76 shown in FIG. 10, the p-type dopant ion implantation process is analogous or equivalent to the ion implantation process 36 shown in FIG. 5 of the first preferred embodiment of the present invention.

The second embodiment of the present invention provides a method for forming within a silicon semiconductor substrate employed within an integrated circuit microelectronics fabrication complementary metal-oxide-silicon (CMOS) field effect transistor (FET) devices with attenuated gate induced drain leakage (GIDL) current, short channel effect (SCE) and punch-through leakage current. Additionally, the gate-drain overlap capacitance is reduced, improving the high-frequency performance of the FET device. Either polarity of FET device may be fabricated within the same silicon substrate as needed for CMOS circuit designs by forming opposite polarity doped regions or wells within the silicon semiconductor substrate and employing analogous or equivalent materials and methods for FET device fabrication as are known in the art of microelectronics fabrication.

Experimental

Figure 11:
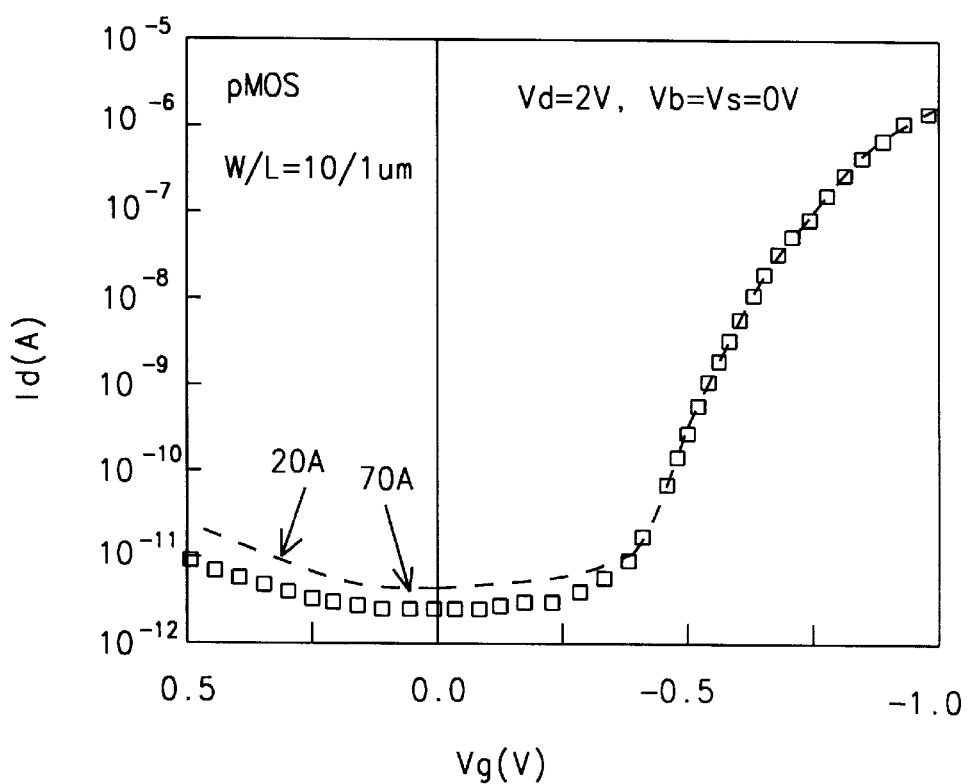
FIG. 11 and FIG. 12 are graphs showing the threshold voltage and drain leakage current versus gate voltage for p-channel CMOS FET devices with gate width/length ratios of 10/10 and 10/0.18 (microns) respectively.
Figure 12:
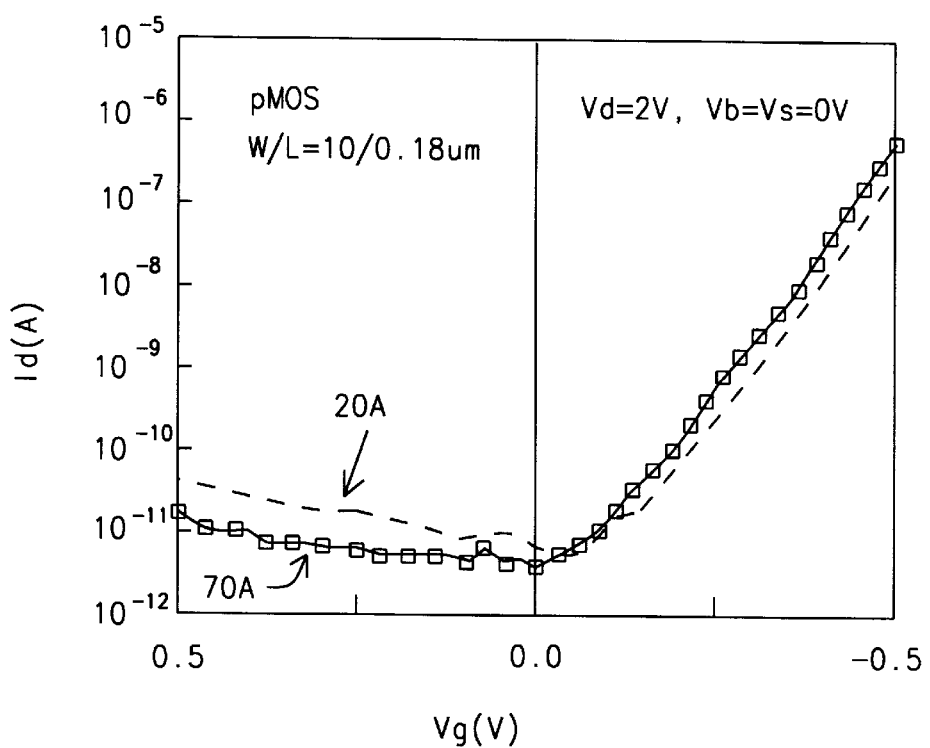

The advantages of the present invention are evident from the experimental data obtained from samples prepared employing the method of the present invention. Experimental p-channel CMOS FET devices were prepared in accord with the process described in the second preferred embodiment of the present invention employing n-type (100) orientation silicon semiconductor substrates of about 5 to about 10 ohm-cm resistivity, wherein the silicon oxide gate oxide dielectric layer was formed by thermal oxidation of the silicon substrate to a thickness of 32 angstroms. After forming the patterned polycrystalline silicon gate electrode layer over the gate oxide layer, the patterned polycrystalline silicon gate electrode layer and the adjacent silicon semiconductor substrate region were thermally oxidized to form a silicon oxide layer whose thickness was about 70 angstroms These experimental p-channel FET devices were compared with p-channel CMOS FET devices, acting as control samples, which were fabricated in the same manner with the exception that the patterned polycrystalline silicon gate electrode layer and adjacent n-type silicon semiconductor substrate region were thermally oxidized to form a silicon oxide layer whose thickness over the adjacent silicon substrate region was about 20 angstroms and no anisotropic self-aligned plasma etch back of the regrown silicon oxide dielectric layer was employed. The drain current for each set of FET device samples was measured as a function of gate voltage. The results are shown in FIG. 11 for sample devices with a gate width/length ratio of 10 u/10 u. The results indicate clearly that the experimental p-channel FET device drain leakage current in the "off" gate bias voltage condition is about half the drain leakage current for the p-channel control sample FET devices in the same "off" gate bias voltage condition. Additional data are shown in FIG. 12, which shows the drain current versus gate voltage for p-channel FET devices with a different geometry: viz. gate length/width ratio of 10 u/0.18 u. As in FIG. 11, experimental p-channel FET drain leakage current in the "off" gate bias voltage condition is about half the value measured for the control p-channel FET devices in the same "off" gate bias voltage condition.

In a second set of measurements, the gate-drain overlap capacitance was measured for the experimental FET devices wherein a thicker silicon oxide gate oxide dielectric layer is formed at the edge of the gate electrode layer by thermal oxidation regrowth, and compared with FET device control samples with no regrown silicon oxide gate oxide dielectric layer. The results are shown below in Table I:

TABLE I

| Gate-Drain Overlap Capacitance for P-Channel FET Devices, in Picofarads (pf) | | |
| --- | --- | --- |
| Sample | Experimental | Control |
| Capacitance, pf | 0.26 | 0.29 |

The thicker silicon oxide gate oxide dielectric layer at the edge of the gate electrode layer due to thermal re-oxidation has resulted in a lower value of the gate-drain overlap capacitance for the FET samples fabricated employing the method of the second preferred embodiment of the present invention.

As is understood by a person skilled in the art, the preferred embodiment of the present invention is illustrative of the present invention rather than limiting of the present invention. Revisions and modifications may be made to materials, structures and dimensions through which is provided the preferred embodiment of the present invention while still providing embodiments which are within the spirit and scope of the present invention, as defined by the appended claims.

What is claimed is:

1. A method for forming within a silicon semiconductor substrate employed within a microelectronics fabrication a field effect transistor (FET) device with attenuated drain leakage, short channel effect and punch-through leakage current comprising:

providing a silicon semiconductor substrate;

forming within the silicon semiconductor substrate field oxide isolation regions defining an active device region within said substrate;

forming over the active region a silicon oxide gate oxide insulation layer;

forming over the gate oxide insulation layer a patterned polycrystalline silicon layer which constitutes a gate electrode pattern;

thermally oxidizing the silicon substrate and polycrystalline silicon gate electrode to form a thicker silicon oxide layer at the edge of the gate electrode and beyond;

forming spacers by etching back by means of anisotropic self-aligned etching the thicker silicon oxide layer at the edge of the gate electrode and beyond;

using said spacers as a mask to implant ions to define shallow source and drain extension regions; and forming source and drain regions employing ion implantation using said spacers as a mask.

2. The method of claim 1 wherein the field oxide isolation regions are formed employing thermal oxidation of the silicon semiconductor substrate.

3. The method of claim 1 wherein the silicon oxide gate oxide dielectric layer is formed employing thermal oxidation.

4. The method of claim 1 wherein the polycrystalline silicon gate electrode layer is formed employing chemical vapor deposition (CVD) method.

5. The method of claim 1 wherein the low energy ion implantation of the source-drain extension regions employs process conditions consisting of:

ion species selected from the ion species B, As and $BF_2$;

accelerating voltage greater than about 6 kilo-electron-volts (kEv);

ion dose greater than about 1E13 ions per square centimeter ($cm^2$);

annealing temperature from between about 900 to about 1050 degrees centigrade.

6. The method of claim 1 wherein the source-drain regions are formed by ion implantation employing process conditions consisting of:

ion species selected from the ion species B, As and $BF_2$;

accelerating voltage from between about 1 to about 100 kilo-electron-volts (kEv);

ion dose greater than about 1E13 ions per square centimeter ($cm^2$);

annealing temperature from abetween about 900 to about 1050 degrees centigrade.

7. A method for forming within a silicon semiconductor substrate, employed within an integrated circuit microelectronics fabrication, complementary metal-oxide-silicon (CMOS) field effect transistor (FET) devices comprising:

providing a silicon semiconductor substrate of one polarity;

forming within the silicon substrate an active device well, of opposite polarity, defined by field oxide dielectric isolation regions;

forming over the silicon substrate active device region well silicon oxide gate oxide dielectric layers;

forming over the silicon oxide gate oxide dielectric layers a patterned polycrystalline silicon gate electrode layer;

thermally oxidizing the polycrystalline gate electrode layer and the silicon substrate to form a thicker silicon oxide dielectric layer at the edge and sides of the patterned polycrystalline silicon gate electrode layer and the silicon substrate regions beyond the gate electrode;

forming spacers by etching back the silicon oxide dielectric layer beyond the edge of the patterned gate electrode layer;

using spacers as a mask to implant ions to define shallow junction regions adjacent to the patterned gate electrode layer; and forming source and drain regions employing ion implantation using said spacers as a mask.

8. The method of claim 7 wherein the silicon active device area well is of n-type doping and the silicon semiconductor substrate is of opposite polarity p-type doping.

9. The method of claim 7 wherein the field oxide (FOX) dielectric isolation regions are formed by thermal oxidation of the silicon semiconductor substrate.

10. The method of claim 7 wherein the silicon oxide gate oxide dielectric layer is formed employing thermal oxidation of the silicon semiconductor substrate.

11. The method of claim 7 wherein the patterned polycrystalline silicon gate electrode layer is formed employing chemical vapor deposition (CVD).

12. The method of claim 7 wherein the low-energy p-type dopant ion implantation process for forming shallow junction p- source-drain extension regions consists of:

ion species selected from the ion species B and $BF_2$;

accelerating voltage greater than about 6 kilo-electron-volts (kEv);

ion dose greater than about 1E13 ions per square centimeter ($cm^2$); and annealing temperature from between about 900 to about 1050 degrees centigrade.

13. The method of claim 7 wherein the $p^+$ source and drain regions are formed employing p-type dopant ion implantation processes consisting of:

ion species selected from the ion species B and $BF_2$;

accelerating voltage from between about 1 to about 100 kilo-electron-volt (kEv);

ion dose greater than about 1E13 ions per square centimeter ($cm^2$); and annealing temperature from between about 900 to about 1050 degrees centigrade.

14. A method for forming within a silicon semiconductor substrate employed within a microelectronics fabrication a field effect transistor (FET) device with attenuated drain leakage, short channel effect and punch-through leakage current comprising:

providing a silicon semiconductor substrate;

forming within the silicon semiconductor substrate field oxide isolation regions defining an active device region within said substrate;

forming over the active region a silicon oxide gate oxide insulation layer;

forming over the gate oxide insulation layer a patterned polycrystalline silicon layer which constitutes a gate electrode pattern;

thermally oxidizing the silicon substrate and polycrystalline silicon gate electrode to form a thicker silicon oxide layer at the edge of the gate electrode and beyond;

forming spacers by etching back by means of anisotropic self-aligned etching the thicker silicon oxide layer at the edge of the gate electrode and beyond;

using said spacers as a mask to implant ions to define shallow source and drain extension regions; and forming source and drain regions employing ion implantation using said spacers as a mask;

wherein the anisotropic self-aligned etch back process employs a plasma etching environment consisting of:

CF$_4$ or CHF$_3$ etching gasses;
temperature from between about 10 to about 200 degrees centigrade;
power from between about 100 to about 1000 watts; and
pressure from between about 1 to about 5000 milliTorr.

15. A method for forming within a silicon semiconductor substrate, employed within an integrated circuit microelectronics fabrication, complementary metal-oxide-silicon (CMOS) field effect transistor (FET) devices comprising:

providing a silicon semiconductor substrate of one polarity;

forming within the silicon substrate an active device well, of opposite polarity, defined by field oxide dielectric isolation regions;

forming over the silicon substrate active device region well silicon oxide gate oxide dielectric layers;

forming over the silicon oxide gate oxide dielectric layers a patterned polycrystalline silicon gate electrode layer;

thermally oxidizing the polycrystalline gate electrode layer and the silicon substrate to form a thicker silicon oxide dielectric layer at the edge and sides of the patterned polycrystalline silicon gate electrode layer and the silicon substrate regions beyond the gate electrode;

forming spacers by etching back the silicon oxide dielectric layer beyond the edge of the patterned gate electrode layer;

using spacers as a mask to implant ions to define shallow junction regions adjacent to the patterned gate electrode layer; and forming source and drain regions employing ion implantation using said spacers as a mask;

wherein the anisotropic self-aligned etch process is a plasma process employing the following conditions:
CF$_4$ or CHF$_3$ etching gasses;
power from between about 100 to about 1000 watts;
temperature from about 10 to about 200 degrees centigrade; and
pressure from between about 1 to about 500 milliTorr.

16. A method for forming within a silicon semiconductor substrate employed within a microelectronics fabrication a field effect transistor (FET) device with attenuated drain leakage, short channel effect and punch-through leakage current comprising:

providing a silicon semiconductor substrate;

forming within the silicon semiconductor substrate field oxide isolation regions defining an active device region within said substrate;

forming over the active region a silicon oxide gate oxide insulation layer;

forming over the gate oxide insulation layer a patterned polycrystalline silicon layer which constitutes a gate electrode pattern;

thermally oxidizing the silicon substrate and polycrystalline silicon gate electrode to form a thicker silicon oxide layer at the edge of the gate electrode and beyond;

forming spacers by etching back by means of anisotropic self-aligned etching the thicker silicon oxide layer at the edge of the gate electrode and beyond;

using said spacers as a mask to implant ions to define shallow source and drain extension regions; and forming source and drain regions employing ion implantation using said spacers as a mask;

wherein the polycrystalline silicon gate electrode and the silicon substrate region beyond are thermally oxidized to form a silicon oxide layer whose thickness is about 70 angstroms.

17. A method for forming within a silicon semiconductor substrate, employed within an integrated circuit microelectronics fabrication, complementary metal-oxide-silicon (CMOS) field effect transistor (FET) devices comprising:

providing a silicon semiconductor substrate of one polarity;

forming within the silicon substrate an active device well, of opposite polarity, defined by field oxide dielectric isolation regions;

forming over the silicon substrate active device region well silicon oxide gate oxide dielectric layers;

forming over the silicon oxide gate oxide dielectric layers a patterned polycrystalline silicon gate electrode layer;

thermally oxidizing the polycrystalline gate electrode layer and the silicon substrate to form a thicker silicon oxide dielectric layer at the edge and sides of the patterned polycrystalline silicon gate electrode layer and the silicon substrate regions beyond the gate electrode;

forming spacers by etching back the silicon oxide dielectric layer beyond the edge of the patterned gate electrode layer;

using said spacers as a mask to implant ions to define shallow junction regions adjacent to the patterned gate electrode layer; and forming source and drain regions employing ion implantation using said spacers as a mask;

wherein the patterned polycrystalline silicon gate electrode layer and silicon substrate region beyond the gate electrode are thermally oxidized to form a silicon oxide dielectric layer whose thickness is about 70 angstroms.

* * * * *